United States Patent [19]

Bergmont

[11] Patent Number: 5,120,670
[45] Date of Patent: Jun. 9, 1992

[54] THERMAL PROCESS FOR IMPLEMENTING THE PLANARIZATION INHERENT TO STACKED ETCH IN VIRTUAL GROUND EPROM MEMORIES

[75] Inventor: Albert M. Bergmont, San Jose, Calif.

[73] Assignee: National Semiconductor Corporation, Santa Clara, Calif.

[21] Appl. No.: 687,106

[22] Filed: Apr. 18, 1991

[51] Int. Cl.⁵ .......................................... H01L 21/311
[52] U.S. Cl. ........................................ 437/43; 437/42; 437/979; 437/985
[58] Field of Search .................... 437/42, 43, 49, 52, 437/915, 979, 984, 985; 148/DIG. 163

[56] References Cited

U.S. PATENT DOCUMENTS

| | | | |
|---|---|---|---|
| 4,795,719 | 1/1989 | Eitan | 437/43 |
| 4,833,514 | 5/1989 | Esquivel et al. | 437/43 |
| 4,849,369 | 7/1989 | Jeuch et al. | 437/43 |
| 4,861,730 | 8/1989 | Hsia et al. | 437/984 |
| 4,892,840 | 1/1990 | Esquivel et al. | 437/52 |
| 5,028,553 | 7/1991 | Esquivel et al. | 437/49 |

Primary Examiner—Brian E. Hearn
Assistant Examiner—C. Chaudhari
Attorney, Agent, or Firm—Limbach & Limbach

[57] ABSTRACT

The present invention provides a method of fabricating a virtual ground EPROM cell in a silicon substrate of P-type conductivity. In accordance with the method, a gate oxide layer is formed on the silicon substrate. This is followed by the formation of a first layer of polysilicon (poly 1). Next, a composite structure comprising oxide-nitride-oxide (ONO) is formed on the first polysilicon layer. Next, a photoresist mask is used to define parallel lines of ONO/poly 1. After etching the ONO/poly 1 to define the parallel lines, an arsenic implant is performed while keeping the photoresist mask in place to define N+ bit lines between the lines of ONO/poly 1. After the photoresist is stripped from the parallel lines of ONO/poly 1, an oxidation step is performed to complete the oxidation of the ONO and to simultaneously grow a differential oxide between the lines of ONO/poly 1. In the subsequent etching of the ONO/poly 1 lines in a stacked etch procedure, the differential oxide overlying the N+ bit lines protects the underlying substrate, thus avoiding interruption ("digging") of N+ bit lines in the EPROM array.

13 Claims, 4 Drawing Sheets

THERMAL PROCESS FOR IMPLEMENTING THE PLANARIZATION INHERENT TO STACKED ETCH IN VIRTUAL GROUND EPROM MEMORIES

BACKGROUND OF THE INVENTION

1. Field of the Invention

The present invention relates to electrically programmable read only memory (EPROM) devices and, in particular, to a process for fabricating a stacked etch, virtual ground EPROM cell without the planarization problems commonly encountered in fabricating such cells.

2. Discussion of the Prior Art

An electrically programmable read only memory (EPROM) device is a non-volatile memory integrated circuit which is used to store binary data. Power can be removed from the EPROM without loss of data. That is, upon reapplying power, the originally stored binary data is retained.

In addition to its data retention capability, an EPROM can also be programmed to store new binary data. Reprogramming is accomplished by first exposing the EPROM to an ultra-violet (UV) light source in order to erase the old binary data. A UV-transparent lid on the packaged EPROM chip allows this erasure to occur. Following erasure, the new binary data is written to the EPROM by deactivating the chip select line in order to switch the EPROM data outputs to inputs. The EPROM address inputs are then set to a starting value, the desire data is connected to the data inputs and the data is written into the data storage register identified by the address inputs. The address inputs are then incremented and the cycle is repeated for each data storage register in the EPROM array.

In an EPROM read operation, the binary data stored in the data storage register identified at the address inputs is connected to the chip's data output buffers. If the EPROM chip select signal is activated, then the binary data from the selected storage register is provided to the databus.

An electrically erasable programmable read only memory (EEPROM) is a variation of the EPROM design wherein binary data is read, written and erased electrically. A single operation erases the selected data storage register. In the case of a so-called "flash" EPROM, all data storage registers in the memory array are electrically erased in a single operation.

FIG. 1A shows a conventional EPROM cell 10. The EPROM cell 10 includes a buried N+ source region 12 and a buried N+ drain region 14 formed in a P-type silicon substrate 16 and separated by a substrate channel region 18. Overlying the channel region 18 is a layer of insulating material 20, typically silicon dioxide. A conductive floating gate 22 is formed on the insulating material 20. Typically, floating gate 22 is formed of polycrystalline silicon (poly 1). Overlying floating gate 22 is a second layer 24 of insulating material, typically, a composite layer of oxide-nitride-oxide (ONO). A conductive control gate 26 is formed on the ONO layer 24. Typically, the control gate 26 is also formed of polycrystalline silicon (poly 2).

A plan view of this so-called "stacked gate" (or "stacked etch") EPROM cell 10 is shown in FIG. 1B. The structure of the standard "T-shaped" cell 10 shown in FIG. 1B derives its "stacked-gate" designation because of the self-aligned etching process which is utilized to form the vertically-aligned control gate 26 and floating gate 22 of the cell 10. That is the edges of the control gate 26 are used to complete the definition of the underlying floating gate 22.

The processing sequence for forming the polysilicon floating gate 22 and the polysilicon control gate line 26 of the stacked gate cell 10 is as follows. Referring to FIG. 1A, first, a layer of polysilicon (poly 1) is formed on the silicon dioxide layer 20. The poly 1 layer is then masked and etched to form the floating gate 22. Next, an ONO layer 24 is grown over the entire structure. This is followed by growth of a second polysilicon layer (poly 2) from which the control gate line 26 will be formed. The poly 2 layer is then masked and etched. The resulting poly 2 control gate line 26 is then used as a self-aligned mask to etch the interpoly ONO 24 and the underlying floating gate 22 to define the final structure of the stacked gate cell 10 shown in FIG. 1A.

Traditionally, reductions in EPROM memory array density have been accomplished by reducing the dimensions of the cell features produced by the photolithographic and etching procedures utilized in fabricating standard T-shaped EPROM cells. The shrinking cell geometries resulting from these process developments have led to corresponding requirements for new isolation schemes in order to accommodate the minimum cell pitch and to develop the sub-micron contacts which must be formed utilizing non-standard techniques.

For example, Hisamune et al, "A 3.6 nM$^2$ Memory Cell Structure for 16MB EPROMs, IEDM 1989, page 583, disclose a process for minimizing EPROM cell pitch utilizing trench isolation of the bit lines and tungsten plugs for bit line contacts. Bergemont et al, "A High Performance CMOS Process for Submicron 16MB EPROM", IEDM 1989, page 591, also disclose techniques for reducing the size of the standard T-shaped EPROM cell.

One way to avoid the special processing requirements associated with the fabrication of high density T-shaped EPROM cell arrays is to use a different type of cell which does not require conventional LOCOS field oxide isolation and contacts in the array.

A three-dimensional schematic diagram of a portion of one such EPROM array is shown in FIG. 2. The FIG. 2 array utilizes planarized oxide over the buried N+ bit lines and bit line isolation to improve array density.

FIGS. 3A-3D show the fabrication process for the FIG. 2 array. Following formation of the poly 1 floating gates, an arsenic implant is utilized to define the buried N+ bit lines. A layer of oxide is then deposited (typically by LPCVD) and then photoresist is spun on. FIG. 3B shows the resulting structure prior to planarization. Next, as shown in FIG. 3C, the surface of the structure is etched back to planarize the oxide between the poly 1 lines. This is followed by formation and definition of an oxide-nitride-oxide (ONO) layer and an overlying second layer of control gate polysilicon (poly 2).

However, the EPROM cell array shown in FIG. 2 also suffers from process difficulties. For example, when etching the residual part of the stack, i.e. the oxides-nitride-oxide (ONO)/poly 1, that portion of the buried N+ bit line which is not covered by poly 1 must have a sufficient silicon dioxide thickness covering it to avoid digging into the bit line when etching the residual poly 1. Otherwise, the N+ bit line may be interrupted.

As stated above, the conventional solution to this bit line "digging" problem is to planarize the oxide between adjacent poly 1 lines. However, this creates three additional problems. First, the plasma etch-back planarization process is extremely complicated. Second, forming a good quality ONO layer over the poly 1 after the etch-back is difficult, since the surface of the poly 1 has been exposed to the plasma silicon dioxide etch-back process. Third, the polysilicon must be implanted at the same time as the buried N+ bit line arsenic implant, which can make it difficult to grow a good quality interpoly oxide and can also lead to problems of data retention reliability.

SUMMARY OF THE INVENTION

The present invention provides a method of fabricating a virtual ground EPROM cell in a silicon substrate of P-type conductivity. In accordance with the method, a gate oxide layer is formed on the silicon substrate. This is followed by the formation of a first layer of polysilicon (poly 1). Next, a composite structure comprising oxide-nitride-oxide (ONO) is formed on the first polysilicon layer. Next, a photoresist mask is used to define parallel lines of ONO/poly 1. After etching the ONO/poly 1 to define the parallel lines, an arsenic implant is performed while keeping the photoresist mask in place to define N-type bit lines between the lines of composite ONO and poly 1. After the photoresist is stripped from the parallel lines of ONO/poly 1, an oxidation step is performed to complete the oxidation of the ONO and to simultaneously grow a differential oxide between the N+ bit lines and poly 1. In the subsequent etching of the ONO/poly 1 lines in a stacked etch procedure, the differential oxide overlying the N+ bit lines will protect the underlying silicon substrate against "digging", thus avoiding interruption of N+ bit lines in the EPROM array.

A better understanding of the features and advantages of the present invention will be obtained by reference to the following Detailed Description of the Invention and accompanying drawings which set forth an illustrative embodiment in which the principles of the invention are utilized.

DETAILED DESCRIPTION OF THE INVENTION

Figure 1A:
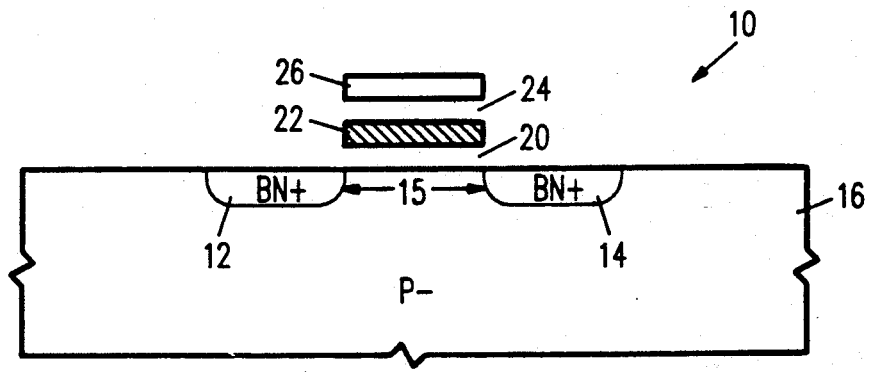
FIG. 1A is a cross-sectional view illustrating a conventional stacked etch EPROM cell.
Figure 1B:
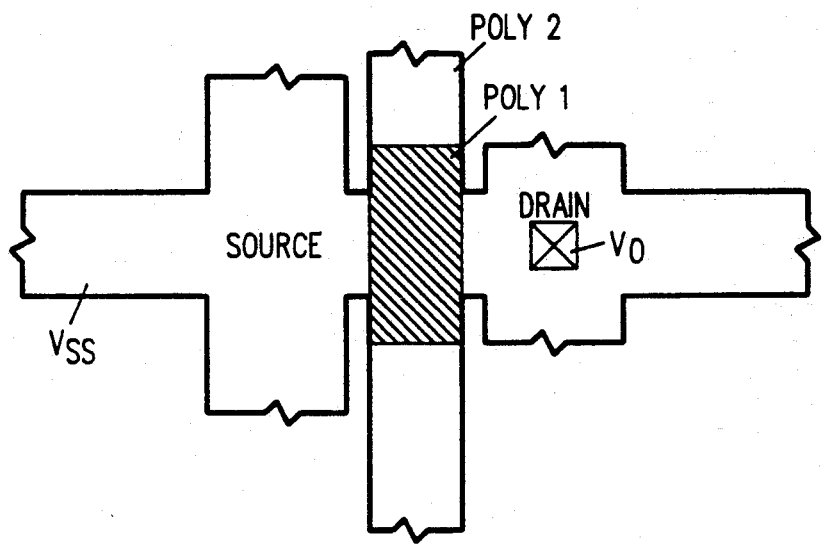
FIG. 1B is a plan view illustrating the layout of a conventional T-shaped stacked etch EPROM cell.
Figure 2:
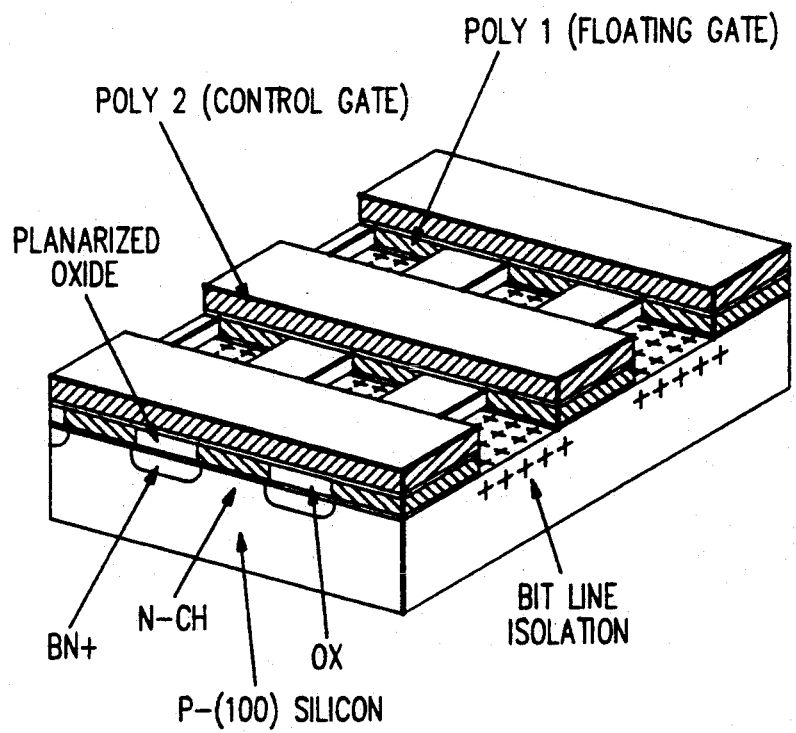
FIG. 2 is a three dimensional schematic diagram illustrating a portion of an EPROM array fabricated utilizing conventional planarization techniques.
Figure 3A:
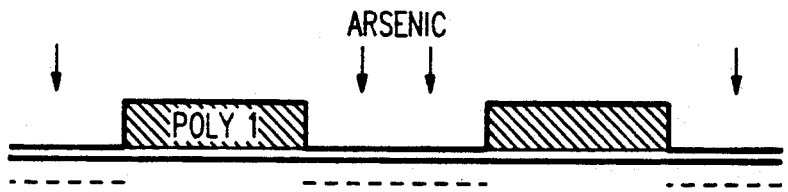
FIGS. 3A-3D illustrate the formation of a conventional EPROM cell utilizing conventional planarization techniques.
Figure 3B:
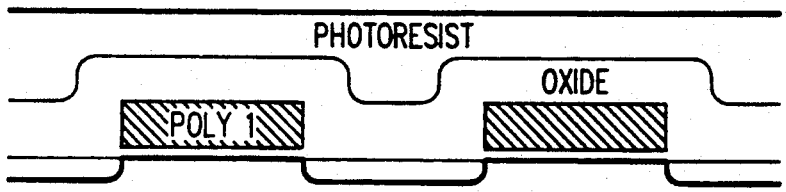
Figure 3C:
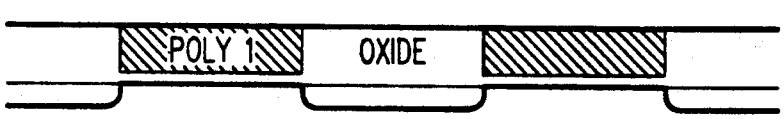
Figure 3D:
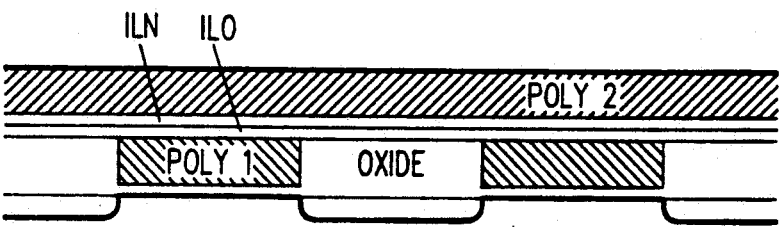

The present invention provides a new thermal process for fabricating a virtual ground EPROM cell that is structurally similar to that described above with respect to FIG. 2. However, the process of the present invention produces oxide planarization between the poly 1 floating gate lines without the problems of the prior art process. That is, the need for an etch-back silicon dioxide plasma step and an arsenic implant into the poly 1 at the time of formation of the N+ bit lines are eliminated.

Figure 4:
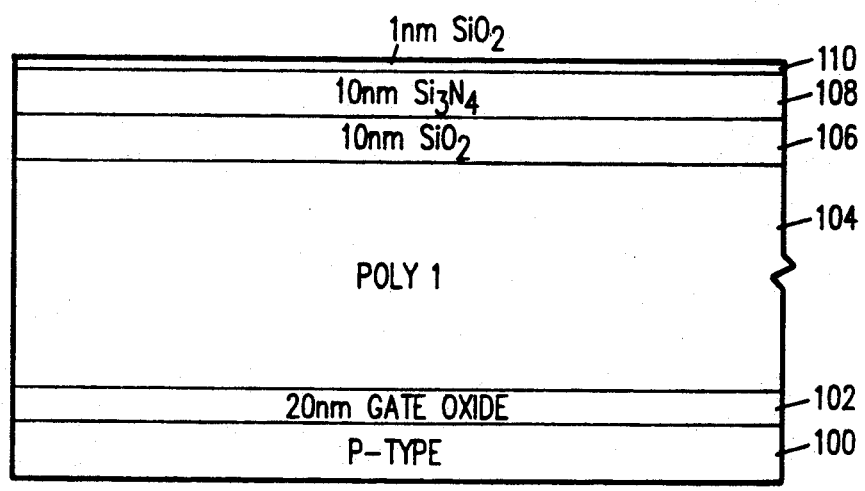
FIG. 4 is a cross-sectional view illustrating the initial steps in a planarization process in accordance with the present invention.

Referring to FIG. 4, in accordance with the process of the present invention, after growing a 200 Å gate oxide layer 102 on an underlying substrate of P-type <100> silicon 100, a thin polysilicon layer 104, approximately 1000–1500 Å thick, is deposited and then doped in the conventional manner. A first silicon dioxide layer 106 of about 100 Å thickness is then grown on polysilicon layer 104. This is followed by formation of a thin nitride layer 108 about 100 Å thick. Next, the nitride layer 108 is oxidized to generate a top layer 110 silicon dioxide about 10 Å thick, as shown in FIG. 4.

Figure 5:
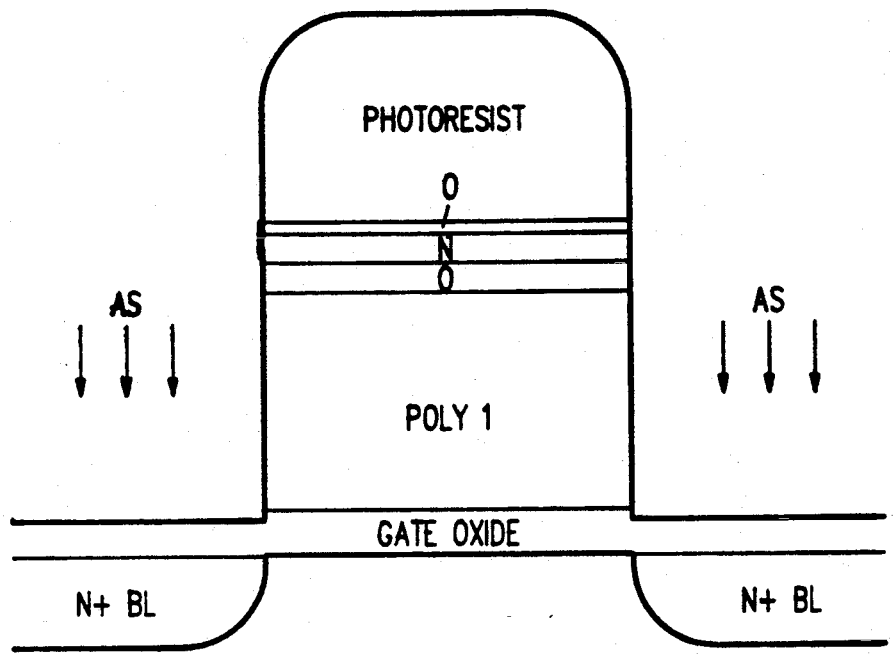
FIGS. 5 and 6 are cross-sectional views illustrating additional steps in the planarization process in accordance with the present invention.
Figure 6:
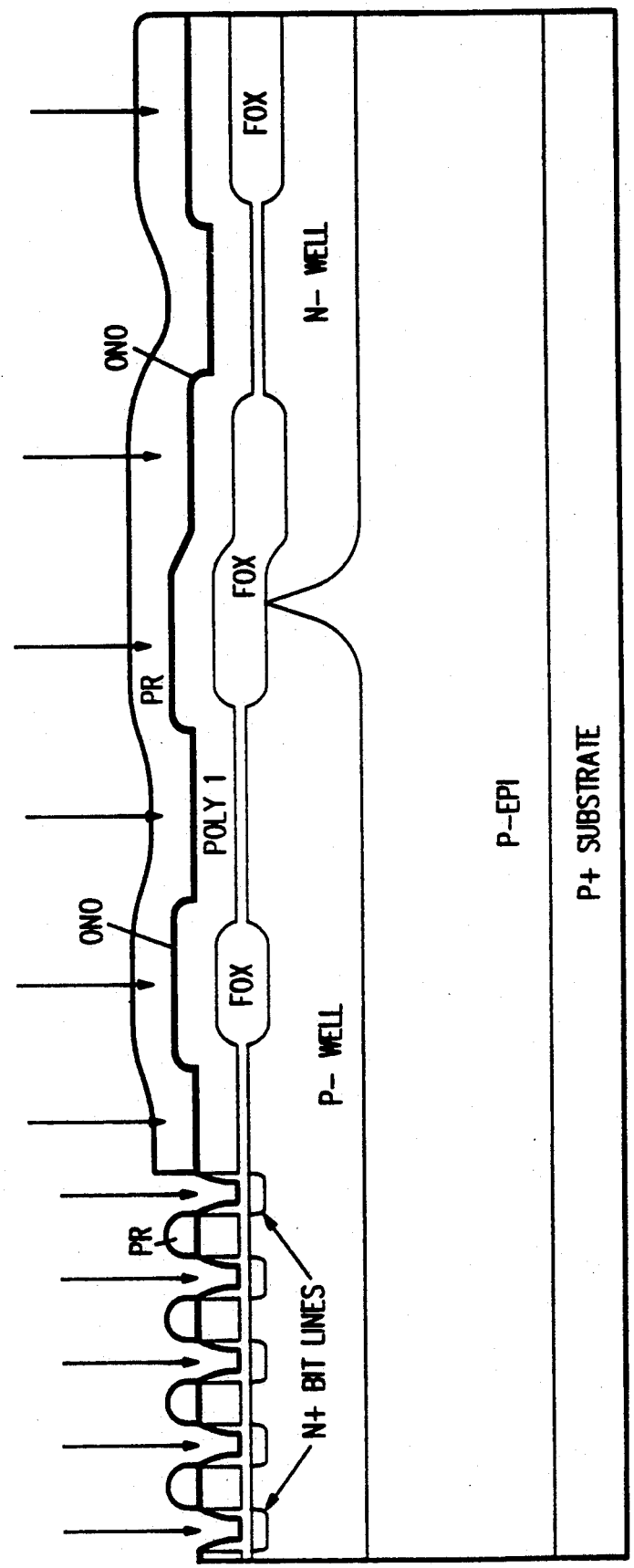

Next, as shown in FIGS. 5 and 6, a poly 1 photoresist mask is used to define parallel lines of the ONO/poly 1. After etching the ONO/poly 1, the structure consists of parallel lines of ONO/poly 1 N+ bit lines are then formed in the substrate by the implantation of arsenic between the ONO/poly 1 lines.

Note that, in accordance with the present invention, the N+ arsenic implant is performed while keeping the photoresist of the poly 1 mask in place. This avoids arsenic implant into the ONO. After the implant, the photoresist is stripped. Also, as shown in FIG. 6, an arsenic implant is avoided in the array periphery utilizing the poly 1 mask; this eliminates the need of the conventional N+ bit line mask.

Figure 7:
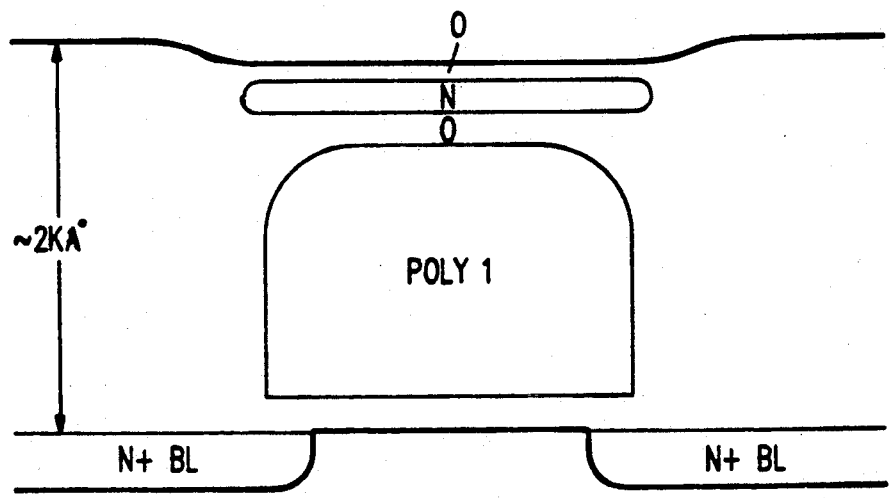
FIG. 7 is a cross-sectional view illustrating the final step in the planarization process in accordance with the present invention.

As shown in FIG. 7, after the photoresist is stripped, an oxidation step is performed to finish the oxidation of the nitride and to generate 30 Å more of silicon dioxide to complete the ONO layer. A 900° C. steam oxidation leads to growth of a differential oxidation between the poly 1 lines. At this temperature, the time required to grow 30 Å of silicon dioxide on the nitride leads to a 1000 Å silicon dioxide thickness on the P- silicon substrate. With a ratio of 2/1 differential oxidation, this leads to 2000 Å of silicon dioxide over the N+ bit line, as shown in FIG. 7.

By this technique, the capacitance between the cell's word line (not shown) and the N+ bit line is minimized.

The etching of the ONO/poly 1 during the subsequent stacked etch portion of the process will etch a maximum of 500 Å over the N+ bit line, leaving at least 1500 Å of silicon dioxide in place, thus avoiding interruption ("digging") of the N+ bit line during the etch step.

Thus, a process in accordance with the present invention avoids the planarization step between the poly 1 lines, arsenic implant into the ONO or poly 1 is well controlled, and thermal oxidations only are involved.

It should be understood that various alternatives to the embodiment in the invention described herein may be employed in practicing the invention. It is intended that the following claims define the scope of the invention and that structures and methods within the scope of these claims and their equivalents be covered thereby.

What is claimed is:

1. A method of fabricating a virtual ground EPROM cell in a silicon substrate of P-type conductivity, the method comprising:
   (a) forming a gate oxide layer on the silicon substrate;
   (b) forming a first polysilicon layer on the gate oxide layer;
   (c) forming a first oxide layer on the first polysilicon layer;
   (d) forming a nitride layer on the first oxide layer;
   (e) forming a second oxide layer on the nitride layer, thereby to form a composite layer of oxide-nitride-oxide (ONO) and first polysilicon on the gate oxide layer;
   (f) forming a mask structure to define parallel lines of ONO/poly 1;
   (g) etching exposed portions of the ONO/poly 1 to define parallel lines of ONO/poly 1;
   (h) while maintaining the mask structure in place, forming lines of N-type conductivity in the silicon substrate between the parallel lines of ONO/poly 1;
   (i) removing the mask structure; and
   (j) performing a differential oxidation to increase the thickness of the second oxide layer while simultaneously forming oxide over the lines of N-type conductivity
   whereby the subsequent etching of the parallel lines of ONO/poly 1 in a stacked etch step of the method etches only a portion of the oxide formed over the lines of N-type conductivity, thereby avoiding interruption of the N+ bit lines of the EPROM cell.

2. A method as in claim 1 wherein the gate oxide layer is about 200 Å thick.

3. A method as in claim 2 wherein the first polysilicon layer is about 1000–1500 Å thick.

4. A method as in claim 3 wherein the first oxide layer is about 100 Å thick.

5. A method as in claim 4 wherein the nitride layer is about 100 Å thick.

6. A method as in claim 5 wherein the second oxide layer is about 100 Å thick.

7. A method as in claim 2 wherein the differential oxidation increases the thickness of the second oxide layer by about 30 Å.

8. A method as in claim 1 wherein the differential oxide forms oxide having a thickness of about 2000 Å over the lines of N-type conductivity.

9. A method of fabricating a virtual ground EPROM cell in a semiconductor substrate of a first conductivity type, the method comprising the steps of:
   (a) forming layer of first dielectric material on the semiconductor substrate;
   (b) forming a layer of conductive material over the first dielectric material;
   (c) forming a layer of second dielectric material over the conductive material;
   (d) forming a mask structure over the second dielectric material to define parallel lines of second dielectric material;
   (e) etching the second dielectric material and the underlying conductive material to provide a plurality of spaced-apart, parallel lines of second insulating material and underlying conductive material;
   (f) while maintaining the mask structure in place on the parallel lines of second insulating material and underlying conductive material, forming regions of a conductivity type opposite the first conductivity type in the semiconductor substrate between the parallel lines of second insulating material and underlying conductive material;
   (g) removing the mask structure from the parallel lines of second insulating material and underlying conductive material; and
   (h) increasing the thickness of the second dielectric material on the parallel lines while simultaneously forming dielectric material over the regions of opposite conductivity type.

10. A method as in claim 9 wherein the semiconductor substrate comprises silicon and the first dielectric material comprises silicon dioxide.

11. A method as in claim 10 wherein the conductive material comprises polysilicon.

12. A method as in claim 11 wherein the second dielectric material comprises oxide-nitride-oxide (ONO).

13. A method as in claim 11 wherein the step of increasing the thickness comprises performing a thermal oxidation step that simultaneously increases the thickness of the top oxide layer of the ONO and of the first dielectric material overlying the regions of opposite conductivity type.

UNITED STATES PATENT AND TRADEMARK OFFICE
CERTIFICATE OF CORRECTION

PATENT NO. : 5,120,670

DATED : June 9, 1992

INVENTOR(S) : Albert M. Bergemont

It is certified that error appears in the above - identified patent and that said Letters Patent is hereby corrected as shown below:

On the title page: Item [75]:
  Please correct inventors name to read as follows:

Albert M. Bergemont

Signed and Sealed this

Tenth Day of August, 1993

Attest:

MICHAEL K. KIRK

*Attesting Officer*   *Acting Commissioner of Patents and Trademarks*